(12) United States Patent
Huynh et al.

(10) Patent No.: US 8,537,593 B2
(45) Date of Patent: Sep. 17, 2013

(54) VARIABLE RESISTANCE SWITCH SUITABLE FOR SUPPLYING HIGH VOLTAGE TO DRIVE LOAD

(75) Inventors: Jonathan Hoang Huynh, San Jose, CA (US); Feng Pan, Fremont, CA (US); Khin Htoo, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 326 days.

(21) Appl. No.: 13/096,516

(22) Filed: Apr. 28, 2011

(65) Prior Publication Data

US 2012/0275225 A1    Nov. 1, 2012

(51) Int. Cl.
G11C 11/00    (2006.01)

(52) U.S. Cl.
USPC ............... 365/148; 365/185.18; 365/189.05; 365/230.06

(58) Field of Classification Search
USPC ................... 365/148, 185.18, 189.05, 230.06
See application file for complete search history.

(56) References Cited

U.S. PATENT DOCUMENTS

| | | | |
|---|---|---|---|
| 4,580,067 A | 4/1986 | Proebsting | |
| 4,678,941 A | 7/1987 | Chao | |
| 4,954,731 A | 9/1990 | Dhong et al. | |
| 5,436,587 A | 7/1995 | Cernea | |
| 5,512,845 A | 4/1996 | Yuh | |
| 5,570,315 A | 10/1996 | Tanaka et al. | |
| 5,723,985 A | 3/1998 | Van Tran et al. | |
| 5,790,453 A | 8/1998 | Chevallier | |
| 5,903,495 A | 5/1999 | Takeuchi et al. | |
| 5,912,838 A | 6/1999 | Chevallier | |
| 5,940,333 A | 8/1999 | Chung | |
| 5,966,331 A | 10/1999 | Shiau et al. | |
| 6,020,778 A | 2/2000 | Shigehara et al. | |
| 6,044,012 A | 3/2000 | Rao et al. | |
| 6,046,935 A | 4/2000 | Takeuchi et al. | |
| 6,078,518 A | 6/2000 | Chevallier | |

(Continued)

FOREIGN PATENT DOCUMENTS

EP    0 475 407    3/1992
JP    02 034022 A    2/1990

(Continued)

OTHER PUBLICATIONS

U.S. Appl. No. 12/973,493, filed Dec. 20, 2010, 28 pages.

(Continued)

*Primary Examiner* — Jason Lappas
(74) *Attorney, Agent, or Firm* — Davis Wright Tremaine LLP

(57) ABSTRACT

A circuit for supplying a high voltage to load is described. An example of such a circuit could be used in the peripheral circuitry of a non-volatile memory device for supplying a program voltage from a charge pump to a selected word line. The circuit includes a charge pump that generates the high voltage and decoding circuitry that is connected to receive this high voltage and selectively apply it to a load. The decoding circuitry receives the high voltage through a switch, where the switch is of a variable resistance that progressively passes the high voltage in response to a control signal. In a particular example, the switch includes a transistor connected between the charge pump and the decoding circuitry, where the control gate of the transistor is connected to the output of a second charge pump that is connected to receive the high voltage and a settable clock signal as its inputs.

8 Claims, 3 Drawing Sheets

(56) References Cited

U.S. PATENT DOCUMENTS

| | | | |
|---|---|---|---|
| 6,154,085 | A | 11/2000 | Ramakrishnan |
| 6,166,961 | A | 12/2000 | Lee et al. |
| 6,166,982 | A | 12/2000 | Murray et al. |
| 6,169,432 | B1 | 1/2001 | Sharpe-Geisler |
| 6,242,962 | B1 | 6/2001 | Nakamura |
| 6,351,158 | B1 | 2/2002 | Shearon et al. |
| 6,359,496 | B1 | 3/2002 | Steinhagen |
| 6,370,075 | B1 | 4/2002 | Haeberli et al. |
| 6,492,860 | B1 | 12/2002 | Ramakrishnan |
| 6,556,465 | B2 | 4/2003 | Haeberli et al. |
| 6,696,880 | B2 | 2/2004 | Pan et al. |
| 6,717,851 | B2 | 4/2004 | Mangan et al. |
| 6,760,262 | B2 | 7/2004 | Haeberli et al. |
| 6,922,096 | B2 | 7/2005 | Cernea |
| 7,030,683 | B2 | 4/2006 | Pan et al. |
| 7,053,689 | B2 | 5/2006 | Kim |
| 7,135,910 | B2 | 11/2006 | Cernea |
| 7,368,979 | B2 | 5/2008 | Govindu et al. |
| 7,400,171 | B1 | 7/2008 | Montazer |
| 7,492,206 | B2 | 2/2009 | Park et al. |
| 7,515,503 | B2 | 4/2009 | Lee et al. |
| 7,554,311 | B2 | 6/2009 | Pan |
| 7,592,858 | B1 | 9/2009 | Jung |
| 7,609,554 | B2 | 10/2009 | Tanzawa |
| 7,795,952 | B2 | 9/2010 | Lui et al. |
| 7,816,969 | B2 | 10/2010 | Yoo |
| 8,004,340 | B2 | 8/2011 | Guo et al. |
| 8,098,088 | B1 | 1/2012 | Sutandi et al. |
| 8,106,701 | B1 | 1/2012 | Huynh et al. |
| 2006/0114737 | A1 | 6/2006 | Terasawa et al. |
| 2007/0109862 | A1 | 5/2007 | Kim |
| 2007/0126494 | A1 | 6/2007 | Pan |
| 2007/0133300 | A1 | 6/2007 | Tanzawa |
| 2007/0139077 | A1 | 6/2007 | Park et al. |
| 2007/0139099 | A1 | 6/2007 | Pan |
| 2007/0268774 | A1 | 11/2007 | Lee et al. |
| 2008/0198667 | A1 | 8/2008 | Hosomura et al. |
| 2009/0058506 | A1 | 3/2009 | Nandi et al. |
| 2009/0058507 | A1 | 3/2009 | Nandi et al. |
| 2009/0058508 | A1 | 3/2009 | Lin |
| 2009/0059670 | A1* | 3/2009 | Maejima et al. ......... 365/185.18 |
| 2009/0097312 | A1 | 4/2009 | Binboga |
| 2009/0153230 | A1 | 6/2009 | Pan et al. |
| 2009/0153232 | A1 | 6/2009 | Fort et al. |
| 2009/0302930 | A1 | 12/2009 | Pan et al. |
| 2009/0315616 | A1 | 12/2009 | Nguyen et al. |
| 2009/0322413 | A1 | 12/2009 | Huynh et al. |
| 2010/0019832 | A1 | 1/2010 | Pan |
| 2010/0067300 | A1 | 3/2010 | Nakamura |
| 2010/0080063 | A1 | 4/2010 | Nakagawa |
| 2010/0309720 | A1 | 12/2010 | Liu et al. |
| 2011/0018615 | A1 | 1/2011 | Pan |

FOREIGN PATENT DOCUMENTS

| | | |
|---|---|---|
| JP | 3-41694 | 2/1991 |
| JP | 9-139079 | 3/1997 |
| JP | 11-126478 | 5/1999 |

OTHER PUBLICATIONS

U.S. Appl. No. 12/973,641, filed Dec. 20, 2010, 26 pages.
U.S. Appl. No. 12/833,167, filed Jul. 9, 2010, 55 pages.
Feng Pan., "Charge Pump Circuit Design," McGraw-Hill, 2006, 26 pages.
Notification of Transmittal of the International Search Report and the Written Opinion of the International Searching Authority, or the Declaration for International Application No. PCT/US2012/032398 mailed Sep. 6, 2012, 9 pages.
Pylarinos et al., "Charge Pumps: An Overview," Department of Electrical and Computer Engineering, University of Toronto, Proceedings of Symposium May 2003, 7 pages.

* cited by examiner

VARIABLE RESISTANCE SWITCH SUITABLE FOR SUPPLYING HIGH VOLTAGE TO DRIVE LOAD

BACKGROUND

1. Field of the Invention

This application relates generally to integrated circuit semiconductor devices, and, more specifically, to switching circuitry for connecting of a charge pump to a load.

2. Background Information

In an integrated circuit, it is common to need a circuit to provide a voltage from a source to an output in response to an input signal. An example of such a switch is a word line select circuit of in a non-volatile memory. In such a circuit, a relatively high programming voltage from a charge pump is supplied to a word line in response to an input signal at the device to device logic level. For example, in fairly typical values for a NAND type FLASH memory, 10-30V is provided to the word line decoding circuitry in response to a switch turning on. In many systems, if this full voltage is supplied too rapidly, this can be detrimental to device's operation.

SUMMARY OF THE INVENTION

According to a general aspect of the invention, a circuit for applying a high voltage to a load is described. The circuit includes a charge pump circuit to generate a high voltage and decoding circuitry connected to receive the high voltage and selectively apply it to the load. The decoding circuitry receives the high voltage through a switch circuit, where the switch circuit is of a variable resistance to progressively pass the high voltage in response to a control signal.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

As noted in the Background, when supplying a high voltage to a load, such as when the word lines of non-volatile memory are supplied programming voltage from a charge pump, there are cases where this high voltage is best applied to the load at a controlled rate. This situation can be considered further with reference to FIG. 1.

Figure 1:
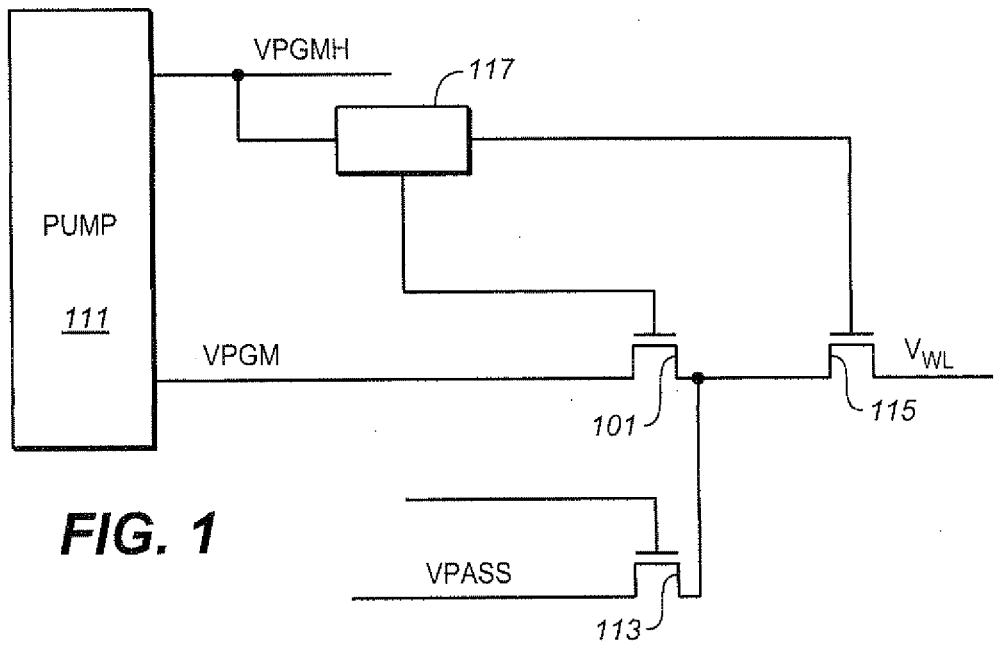
FIG. 1 is a simplified representation of circuitry connecting a charge pump to word line decoder circuitry through a switch using a level shifter.

FIG. 1 is a simplified diagram of an embodiment of some peripheral circuitry such as would be found on a non-volatile memory device. At left, a charge pump PUMP 111 generates a program voltage Vpgm that is to be supplied to selected word lines through the decoding/selection circuitry of the memory, here collectively represented by switch implemented as the transistor 115. Other voltages used on the word lines may also be applied through the decoding/selection circuitry 115. Here, the voltage Vpass that is applied to non-selected word lines of a NAND string during a programming operation is also provided through the transistor 113 to the decoding/selection circuitry 115 when the corresponding control signal is asserted at the control gate of the switch 113. In a write operation for a NAND type device, when a selected word line is to be pulsed, first all of the word lines in a NAND string (selected and non-selected) can be connected by the decoding/selection circuitry, after which the selected word line receives Vpgm while the non-selected word lines are held at Vpass. To supply Vpgm from the pump 111, the 113 is turned off and a level shifter controlled switch 101 is turned on, raising the input to decoding/selection circuitry 115. To be able to fully pass Vpgm, both 101 and 115 have their gates connected to receive a voltage Vpgmh that is elevated from the Vpgm value and is here also provided from charge pump 111. For example, the offset between Vpgm and Vpgmh may be provided a diode connected transistor connected between the outputs. The control gates of 101 and 115 are then supplied though the control circuitry here represented by the box 117 according to the appropriated control signals.

As noted, FIG. 1 is simplified for the purposes of this discussion. More detail on charge pumps, such represented at 111, can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979 7,795,952; and 7,135,910; US Patent Publication numbers 2009-0153230-Al; 2009-0153232-A1; 2009-0315616-A1; 2009-0322413-A1; and 2009-0058506-A1; and applications Nos. 11/295,906 filed on Dec. 6, 2005; 11/303,387 filed on Dec. 16, 2005; 11/845,939, filed Aug. 28, 2007; 12/135,945 filed Jun. 9, 2008; 12/506,998 filed on Jul. 21, 2009; 12/570, 646 filed on Sep. 30, 2009; and 12/973,493 and U.S. application Ser. No. 12/973,641, both filed on Dec. 20, 2010. With respect to non-volatile memory circuits and the various decoding/selection circuitry involved, here collectively represent by the transistor 115, can be found in U.S. Pat. Nos. 5,570,315, 5,903,495, and 6,046,935 and U.S. patent applications Ser. Nos. 12/833,167 filed on Jul. 9, 2010, and 12/635, 449 filed on Dec. 10, 2009.

Returning back to FIG. 1, when the switch 101 is closed, the voltage being supplied through the decoding/selection circuitry 115 to load will rapidly rise to Vpgm from Vpass (in the shown embodiment) or ground or other low voltage (in other embodiments). This can cause various problems, as it places large amounts of stress on the device components and induce various unwanted currents through capacitive couplings. To consider one problem that can arise, the trend in memory devices is for a decrease in scale size and for longer word lines. Along the word line, there will an accumulation of resistance and capacitance along its length for the cells that are further and further from the side from which the programming voltage is applied. Consequently, if the pulse rises too fast, the cumulative RC constant for the far side memory cells will lead to their being subjected to a differing programming pulse than that of the near side cells. This will lead to differing programming behavior and other undesirable non-uniformities in device operation. Because of this, it would lead to more uniform programming if the rise time of Vpgm could be better matched word line characteristics of the device. (The discussion here is for word line voltages, but for a discussion of controlling the ramp rate of voltages on bit lines, which is complementary to the embodiments found here, see U.S. Pat. No. 6,717,851.)

One way to control this rise rate is through the charge pump itself, such as through it clock frequency, but this may undesirably affect other operations on the device. Further, trying to control the rise rate of Vpgm as seen at the selection/decode circuitry is less effective than it may at first appear. This can be seen by considering FIG. 2.

Figure 2:
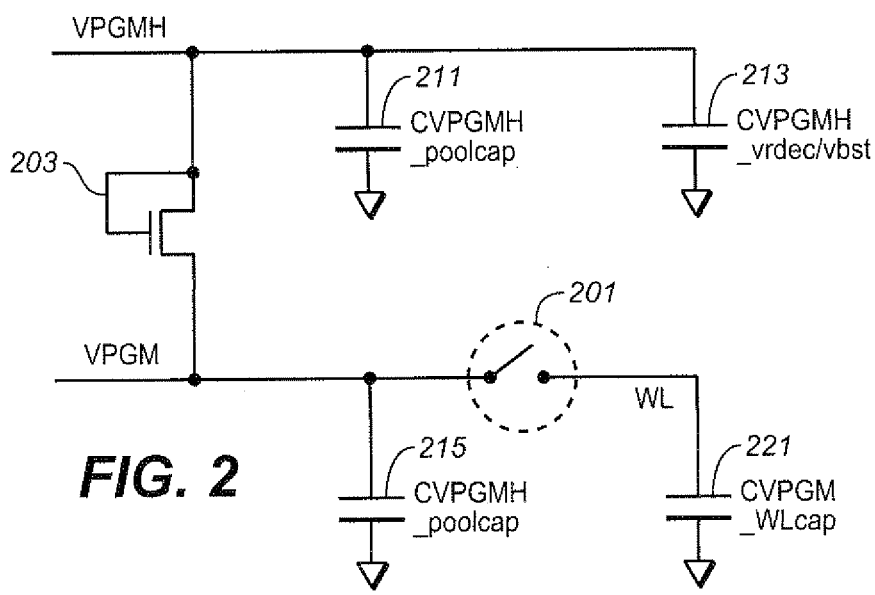
FIG. 2 illustrates some of the capacitances involved in the arrangement of FIG. 1.

FIG. 2 corresponds to FIG. 1, by as a schematic illustration of some of the capacitances involved. At left, the programming voltage Vpgm and the higher programming voltage Vpgmh such as used on the control gates for the selection/decode switches are generated by the charge pump 111 (FIG. 1). As noted above, and discussed in various ones of the references on charge pumps cited above, the offset of this pair of voltages can be established by a diode connected transistor 203. In FIG. 1, the diode 203 would be included within the pump block 111. The capacitances along the Vpgmh line is shown here split into two parts: the capacitor CVPGMH_vrdec/vbst 213 is the cumulative capacitance of the switching and decoding element for which Vpgmh is used that, aside from the single representative switch 115, are not shown in FIG. 1 and would be outside the scope of the elements shown in FIG. 1; and the pool capacitance CVPGMH_poolcap 211 for the various capacitances in the pump system itself and the earlier switching elements leading up to controlling the switch 101 in FIG. 1, labeled 201 in FIG. 2. The pool capacitance in the Vpgm path before the switch 101/201 is represented by CVPGM_poolcap 215, The load capacitance, from the word lines as well as any other capacitance in the path on the far side of the switch 201 is represented in CVPGM_WLCap 221.

Initially, before the switch is closed, CVPGMH_poolcap 211 and CVPGMH_vrdec/vbst 213 will be charged to Vpgmh and CVPGM_poolcap 215 will be charged to Vpgm. On the other side of the switch 201, CVPGM_WLCap 221 will be charged to somewhere from ground to Vpass, but in any case this may be a much lower voltage than the other capacitors. Due to the diode at 203, when the switch 201 is closed, charge can flow from the capacitances 211 and 213 along the Vpgmh line as well from 215 can flow through the switch. In a typically embodiment, (CVPGMH_poolcap+CVPGMH_vrdec/vbst+CVPGM_poolcap)>>CVPGM_WLCap. Consequently, when it comes time to supply Vpgm to a word line and the switch 201 is closed, the voltage supplied to the selected word line will rapidly rise from, say, Vpass to the possibly much higher Vpgm, resulting in the problems discussed above.

Figure 3:
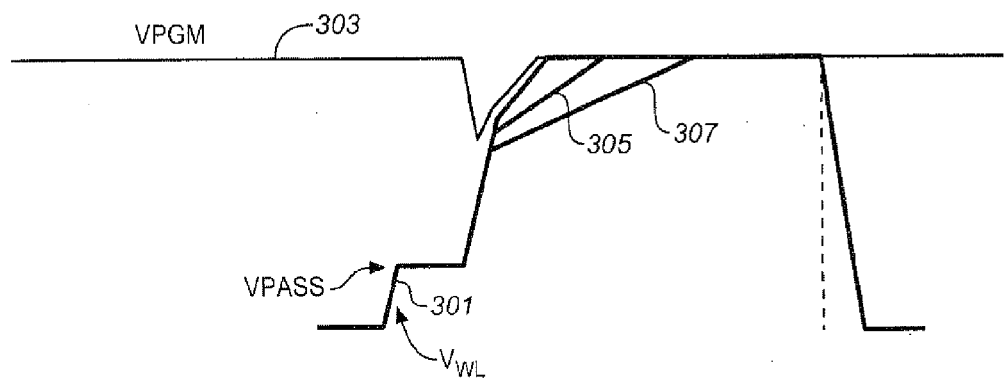
FIG. 3 is a waveform showing the behavior of FIG. 1 in applying the program voltage to a word line.

FIG. 3 is a waveform to schematically illustrate this. Along the top, at 303, is shown the level on the VPGM line, with the trace at 301 showing the level to the left of the switch 101 of FIG. 1 as on the selected word line. Initially, before time $t_1$, the Vpgm supply line to left of is charged up to Vpgrn by the pump 111. Before $t_1$, the word line voltage $V_{WL}$ is initially at ground before (in this embodiment), first taken to Vpass, where it begins to ramp up at $t_1$, reaching Vpass at $t_2$, where it is held until $t_3$ to allow the levels to stabilize. At $t_3$ the switch 101 is closed and the word line begins to charge up to Vpgm.

As the various capacitances 211, 213, 215 to the left of the switch are charged up, even without the pump contributing further, $V_{WL}$ will charge most of the way up to Vpgm. The shown droop in Vpgm 303 is mostly determined by the amount these pooled capacitances relative to the load capacitance 221. At about $t_4$, the pump will then raise Vpgm 303 and $V_{WL}$ 301 back up to the full Vpgm value. After the initial transfer of charge from the various capacitances, at $t_4$ the ramp rate will roll off a little. This region after $t_4$ is the region where the pump can control the ramp rate when the load is connect using the sort of level shifter switch of 101. The pump clock frequency (or other regulation) only can control the actual rise rate due to the pumping rate only from this point. For example, slowing the pump clock some can slow the ramp rate to that shown at 305 or, if slowed yet further, to that shown at 307. In any case though, under the sort of arrangement presented so far, it is only this last portion of the ramp rate (after $t_4$) that can be readily controlled by altering the pump's operation.

Figure 4:
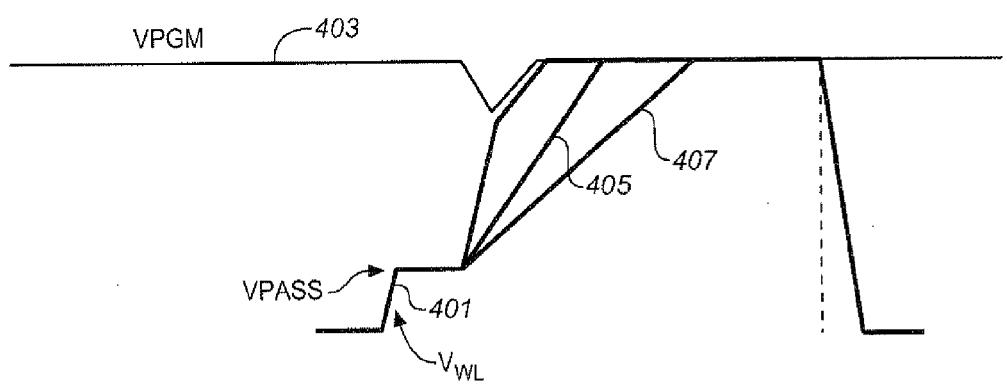
FIG. 4 is a waveform showing preferred behavior when applying the program voltage to a word line.
Figure 5:
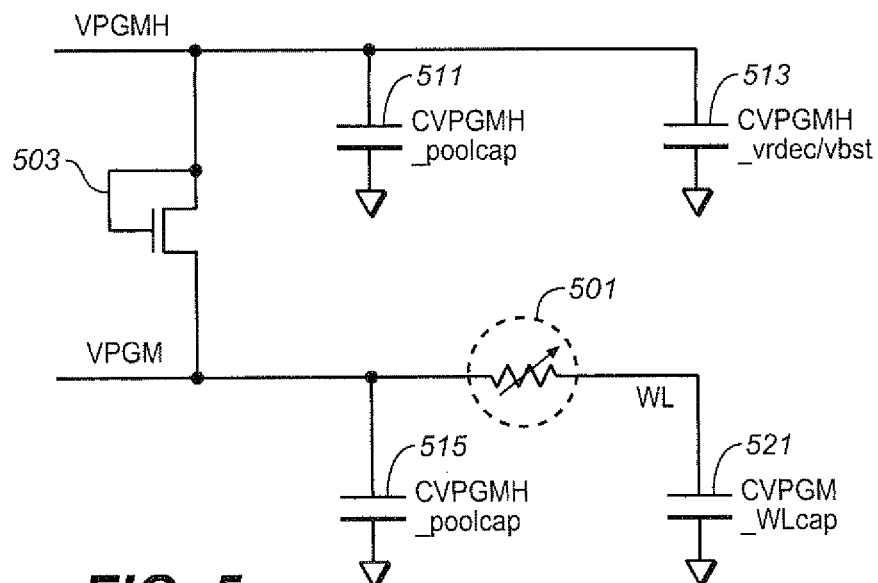
FIG. 5 corresponds to FIG. 2, but with the switch replaced with a variable resistance switch.

FIG. 4 illustrates the desired behavior. Up until $t_3$, the behavior of Vpgm 403 and $V_{WL}$ 401 is much the same as in FIG. 3. The goal is to be able to control the ramp rate from. (in this example) Vpass to the full Vpgm value starting at $t_3$. Examples of this are shown at 405 and 407. In this exemplary embodiment, this is effected by replacing the final switch of the word line connection (101 of FIG. 1) with a controllable impedance, allowing this switch to gradually closed, so that the ramp rate of $V_{WL}$ can be controlled. The exemplary embodiment replaces level-shifter 101 in FIG. 1 with a transistor controller by a mini pump to generate the needed control gate voltage. By using the clock frequency of this mini-pump, the ramping of the selected word line in a write operation can be controlled. This is illustrated schematically in FIG. 5, which corresponds to FIG. 2 and is similarly numbered.

Where FIG. 5 differs from FIG. 2 is that the previous level shifter type switch 201 is replaced with the switch 501 whose resistance is variable and which, in the exemplary embodiment, is a switch whose gate is controlled by a charge pump. This allows the rate at which the switch 501 is closed to be set by the pump's clock frequency. Going back to FIG. 4, the droop in 403 at $t_3$ varying based on the clock frequency for the pump in the switch of 501, with a slower clock resulting in less droop as the switch will be closed more slowly. Once changed to arrangement of FIG. 5, the ramp rate of $V_{WL}$ can be controlled to a rate such as 405 or 407 independently of the initial charge transferred from the pooled capacitances.

Figure 6:
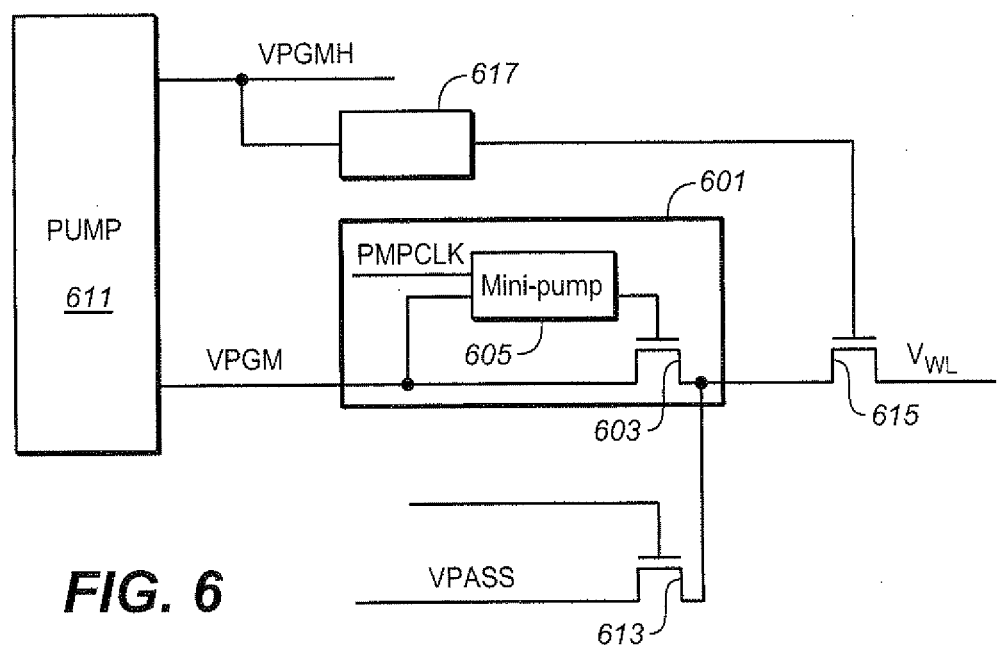
FIG. 6 is a simplified representation of an exemplary embodiment of circuitry connecting a charge pump to word line decoder circuitry.

FIG. 6 is an exemplary embodiment and corresponds to FIG. 1 and has its elements similarly number, but now the level shifter switch 101 of FIG. 1 is instead replaced with the switch 601. The variable resistance switch can again be implemented as a transistor 603, but whose control gate voltage is supplied by mini-pump 605. The pump receives Vpgm as an input and receives the clock signal PMPCLK. This clock signal PMPCLK is, as far as the aspects discussed here are concerned, used just for the mini-pump 603 and is taken as independent of any clock signal used in PUMP 611 to generate Vpgm and Vpgmh. Rather turning the transistor 603 directly on when the appropriate control signal is asserted, as is done in FIG. 1 for transistor 101 by use of a level shifter, the control gate level on 603 is ramped up by the mini-pump 605. This in turn allows the rate at which $V_{WL}$ ramps up to be controlled by the value of PMPCLK.

The value of the clock signal PMPCLK can be controlled by a parameter and is specific for use of the switch to control this voltage. The value can be determined when the device (usually for the type of device, but this could also be for the particular example) is characterized. The value can then be loaded into a register or one time programmable memory (OTP) before the device is shipped out. In more general embodiments, an initial value for the parameter controlling PMCLK could be set, and then subsequently updated by the circuit; for example, in a non-volatile memory system the controller or state machine could update the value based on the number of erase/program cycles (hot count) or could varied dynamically based upon ECC values or program error results.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A circuit for applying a high voltage to a load, the circuit comprising:
    a first charge pump circuit to generate a first high voltage;
    decoding circuitry connected to receive the first high voltage and selectively apply the first high voltage to the load; and
    a first switch circuit through which the decoding circuitry receives the first high voltage, where the first switch circuit is of a variable resistance to progressively pass the first high voltage in response to a first control signal.

2. The circuit of claim 1, wherein the first switch circuit comprises:
    a first transistor connected between the first charge pump and the decoding circuitry; and
    a second charge pump connected to receive the first high voltage and a settable clock signal, and having an output connected to control gate of the first transistor.

3. The circuit of claim 2, wherein the frequency of the settable clock is controlled by a settable parameter.

4. The circuit of claim 1, wherein the first charge pump further supplies a second high voltage, the second high voltage being higher than the first high voltage, and where the decoding circuitry is connected to receive the second high voltage to use for controlling switches contained therein.

5. The circuit of claim 1, wherein the circuit is peripheral circuitry formed on a non-volatile memory circuit, the load is one or more word lines of an array of the non-volatile memory, the first high voltage is a programming voltage, and the decoding circuitry includes word line selection circuitry.

6. The circuitry of claim 1, where in the circuit further comprises:
    a second switch circuit connected to receive an additional voltage level, of a lower level than the first high voltage, and supply the additional voltage level to the decoding circuitry in response to a second control signal.

7. The circuit of claim 6, wherein the load are one or more word lines of a non-volatile memory array having a NAND-type structure, the first high voltage is a programming voltage, and the addition voltage level is a voltage applied to selected word lines during a programming operation.

8. The circuit of claim 7, wherein, during a write operation for selected memory cells along a corresponding selected word line, all of the word lines of the NAND strings to which the selected memory cells belong are initially supplied with the additional voltage level by the decoding circuitry and the selected word line is subsequently supplied with the first high voltage by the decoding circuitry.

* * * * *